(12) United States Patent
Okita et al.

(10) Patent No.: US 10,242,914 B2
(45) Date of Patent: Mar. 26, 2019

(54) ELEMENT CHIP MANUFACTURING METHOD

(71) Applicant: Panasonic Intellectual Property Management Co., Ltd., Osaka (JP)

(72) Inventors: Shogo Okita, Hyogo (JP); Noriyuki Matsubara, Osaka (JP); Atsushi Harikai, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/952,342

(22) Filed: Apr. 13, 2018

(65) Prior Publication Data
US 2018/0342424 A1 Nov. 29, 2018

(30) Foreign Application Priority Data
May 26, 2017 (JP) ................. 2017-104984

(51) Int. Cl.
*H01L 21/027* (2006.01)
*H01L 21/78* (2006.01)
*H01L 21/3065* (2006.01)
*H01L 21/308* (2006.01)
*H01L 21/311* (2006.01)
(Continued)

(52) U.S. Cl.
CPC .............. *H01L 21/78* (2013.01); *G03F 7/039* (2013.01); *G03F 7/091* (2013.01); *G03F 7/16* (2013.01); *G03F 7/168* (2013.01); *G03F 7/2002* (2013.01); *G03F 7/2022* (2013.01); *G03F 7/32* (2013.01); *H01L 21/0274* (2013.01); *H01L 21/308* (2013.01); *H01L 21/3065* (2013.01); *H01L 21/31138* (2013.01); *H01J 37/32724* (2013.01); *H01J 2237/334* (2013.01)

(58) Field of Classification Search
CPC ....... H01L 21/02; H01L 21/78; H01L 21/308; H01L 21/0274; H01L 21/3065; H01L 21/027
See application file for complete search history.

(56) References Cited

U.S. PATENT DOCUMENTS

2002/0195916 A1* 12/2002 Marutsuka ........... H05K 9/0096
                                                        313/112
2006/0108678 A1*  5/2006 Kumar ............... B23K 35/0222
                                                        257/690
2009/0318845 A1* 12/2009 Tokumoto .............. A61N 1/044
                                                        604/20

FOREIGN PATENT DOCUMENTS

JP            2012-248741 A       12/2012

* cited by examiner

*Primary Examiner* — Chuong A Luu
(74) *Attorney, Agent, or Firm* — Pearne & Gordon LLP

(57) ABSTRACT

A semiconductor chip manufacturing method includes forming a mask on a surface of a semiconductor wafer, forming an opening on the mask, exposing a dividing region of the semiconductor wafer, a rear surface of the semiconductor wafer is held by a dicing tape via an adhesive layer, singulating the semiconductor wafer into a plurality of semiconductor chips by etching the semiconductor wafer exposed to the opening with a first plasma until the semiconductor wafer reaches a rear surface, removing the mask so that the plurality of element chips from which the mask is removed are held by the holding sheet via the adhesive layer.
At the time of removing the mask, the mask is removed from an alkaline developer having a dissolution rate of the mask larger than a dissolution rate of the adhesive layer.

11 Claims, 10 Drawing Sheets

(51) Int. Cl.
*G03F 7/20* (2006.01)
*G03F 7/32* (2006.01)
*G03F 7/039* (2006.01)
*G03F 7/16* (2006.01)
*G03F 7/09* (2006.01)
H01J 37/32 (2006.01)

ELEMENT CHIP MANUFACTURING METHOD

BACKGROUND

Technical Field

The present disclosure relates to an element chip manufacturing method.

Description of the Related Art

In manufacturing of an element chip, plasma etching is used in some cases. Plasma etching is widely used, for example, a method called as plasma dicing for singulating a substrate is known as one of them. In plasma dicing, a substrate including a plurality of element regions defined by dividing regions is singulated into each element chip by plasma etching the dividing regions to a depth which extends from one face of the substrate to the other face. In such plasma dicing, only the dividing regions are plasma etched, and the element regions need to be protected from the plasma etching. Therefore, generally, a mask having plasma resistance is formed on the surface of the element region before plasma etching. At this time, the mask formed on the surface of the substrate is removed by ashing or the like after plasma dicing. A method of manufacturing an element chip by a series of flows from such plasma dicing to ashing is disclosed in Japanese Patent Unexamined Publication No. 2012-248741.

SUMMARY

An element chip manufacturing method of the present disclosure includes forming a mask on a first face of a substrate including a plurality of element regions and a dividing region for defining the plurality of element regions; exposing the dividing region of the substrate by forming an opening on the mask; holding a second face by a holding sheet via an adhesive layer, the second face being an opposite side of the substrate with respect to the first face; singulating the substrate into a plurality of element chips by etching the substrate exposed to the opening with a first plasma until the substrate reaches the second face so that the plurality of element chips are held by the holding sheet via the adhesive layer; and ; removing the mask from surfaces of the plurality of element chips so that the plurality of element chips from which the mask is removed are held by the holding sheet via the adhesive layer; in which at the time of removing the mask, the mask is removed from the plurality of element chips with alkaline chemicals having a dissolution rate of the mask greater than a dissolution rate of the adhesive layer.

According to the disclosure, in the element chip manufacturing method, when the mask is removed with the alkaline chemicals, an ashing failure is suppressed, and thereby it is possible to improve productivity of the element chips.

DETAILED DESCRIPTIONS

Figure 1A:
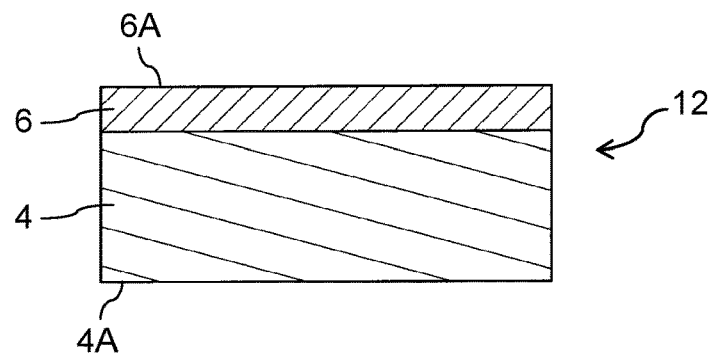
FIG. 1A is a sectional view illustrating a first preparing step of an element chip manufacturing method according to an embodiment.

Prior to the description of the embodiments, problems in the related art will be briefly described.

Since ashing after plasma dicing is performed in a state where the element chip is attached to a holding member having relatively poor heat resistance such as a dicing tape, the temperature during the ashing is required to be maintained at a temperature at which the holding member is not deteriorated, and therefore, the temperature of the mask is likely to be decreased. In a case where the temperature of the mask is decreased, and thus the reactivity of the ashing cannot be secured sufficiently, even if ashing is performed on the mask, ashing residues may be generated. That is, in the ashing disclosed in in Japanese Patent Unexamined Publication No. 2012-248741, there is a concern in that the mask cannot be removed sufficiently. For example, in some cases, the ashing cannot be used for an element chip, which is susceptible to damage by ultraviolet (UV) lays, such as a complementary metal oxide semiconductor (CMOS) image sensor. Accordingly, in the removing of the mask in the element chip manufacturing step such as plasma etching, the ashing is not perfect and there is room for improvement.

In the element chip manufacturing method, an object of the present disclosure is to improve the productivity of the element chip by suppressing the ashing failure.

Hereinafter, exemplary embodiments will be described with reference to the accompanying drawings.

FIG. 1A to FIG. 1M illustrate a manufacturing step of a semiconductor chip (element chip) 2 according to the embodiment of the disclosure. When referring to FIG. 1M which is a completion view and FIG. 1N which is a detailed view thereof, manufactured semiconductor chip 2 is provided with semiconductor layer 4, wiring layer 6 formed on semiconductor layer 4, protective film 8 formed on wiring layer 6, and bump 10 as an electrode. Note that, FIG. 1N is a sectional view, but for clarity of illustration, hatching is not illustrated. For bump 10, solder is generally used, and solder is formed by plating method, printing method or vapor deposition method. Under bump metal (UBM) film 9 is formed on protective film 8 of semiconductor chip 2, and bump 10 is formed on this UBM film 9. That is, UBM film 9 is an under layer of bump 10, and basically has electrical conductivity, and is electrically connected to metal wiring 6B in wiring layer 6. Wiring layer 6 is provided with such a metal wiring 6B, insulating film 6C, and transistor 6D. The material of metal wiring 6B may be, for example, Cu, Al, an Al alloy, and W. The material of insulating film 6C may be, for example, $SiO_2$, SiN, SiOC, or Low-k material. The metal contained in bump 10 may be, for example, an alloy of Cu, Cu, Sn, and Ag, and an alloy of Ag and Sn, Au, Al, or an Al alloy. The shape of bump 10 is not particularly limited, and it may be a prism, a cylinder, a mountain, a ball, or the like. The arrangement and the number of bumps 10 are not particularly limited, and are appropriately set according to the purpose. Here, convex bump 10 as an electrode may be a concave pad electrode. Wiring layer 6 is provided with metal layer 6E called as a test element group (TEG), and more specifically, metal layer 6E is provided over element regions 14 (refer to FIG. 1B) and dividing region 16 (refer to FIG. 1B).

As bump 10, a Cu pillar having a diameter of 40 μm and a height of 50 μm can be exemplified. As wiring layer 6, for example, a wiring layer having a thickness of about 5 μm and including the Low-k material and the Cu wiring can be exemplified. As semiconductor layer 4, a semiconductor layer formed of Si and having a thickness of 70 μm. An insulating film formed of $SiO_2$ having a thickness of about 1 μm may be provided on the side opposite to wiring layer 6 of semiconductor layer 4.

In the first preparing step as illustrated in FIG. 1A, semiconductor wafer (substrate) 12 is prepared. As illustrated in FIG. 1A, semiconductor wafer 12 is provided with semiconductor layer 4 and wiring layer 6 formed on semiconductor layer 4.

Figure 1B:
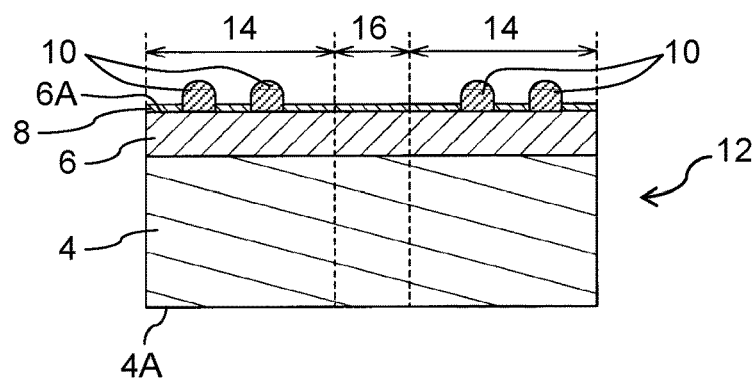
FIG. 1B is a sectional view illustrating a second preparing step of the element chip manufacturing method according to the embodiment.

In the second preparing step as illustrated in FIG. 1B, protective film 8 and bump 10 are formed on surface (the first face) 6A wiring layer 6 of semiconductor wafer 12. Semiconductor wafer 12 that has undergone this process is provided with a plurality of dividing regions 14 in which bump 10 is formed, and dividing region 16 adjacent to each of element regions 14. In other words, each of element regions 14 is defined by dividing region 16.

Figure 1C:
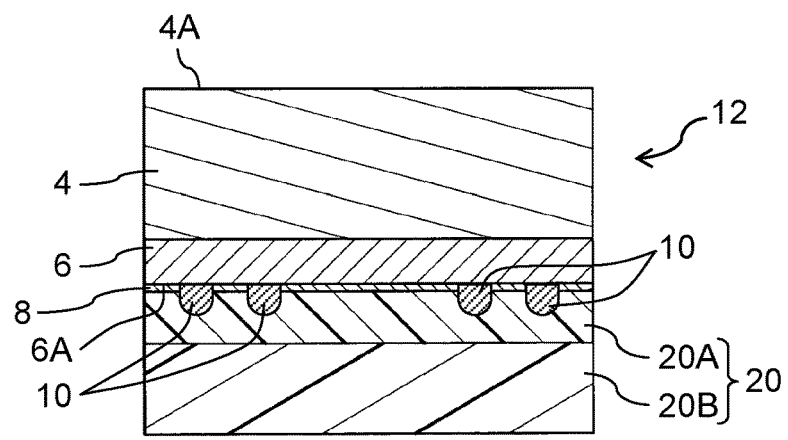
FIG. 1C is a sectional view illustrating a protecting step of the element chip manufacturing method according to the embodiment.

In the protecting step as illustrated in FIG. 1C, BG (back grinding) tape 20 for protecting rear surface 4A during grinding is attached to surface 6A of semiconductor wafer 12. BG tape 20 is a protective film formed of adhesive layer 20A and resin substrate layer 20B. That is, adhesive layer 20A is attached to surface 6A of semiconductor wafer 12, and surface 6A of semiconductor wafer 12 is protected by substrate layer 20B. After or before BG tape 20 is attached to semiconductor wafer 12, semiconductor wafer 12 is cut in accordance with the outer shape of semiconductor wafer 12, and thus the handling properties of semiconductor wafer 12 are not damaged.

Figure 1D:
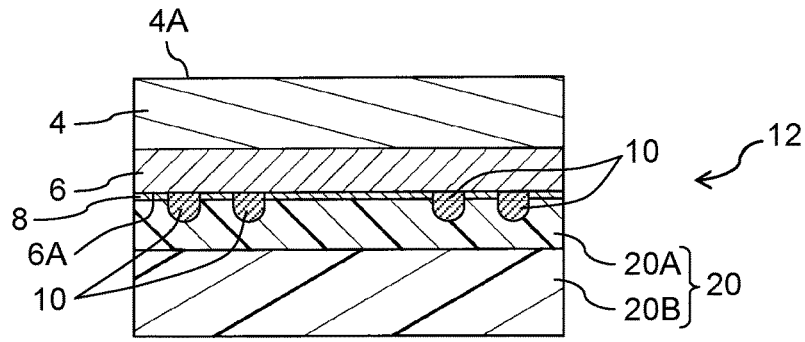
FIG. 1D is a sectional view illustrating a thinning step of the element chip manufacturing method according to the embodiment.

In the thinning step as illustrated in FIG. 1D, semiconductor layer 4 is ground from rear surface (the second face) 4A of semiconductor wafer 12 by a grinding device (not shown). Semiconductor wafer 12 is thinned to a predetermined thickness by grinding semiconductor layer 4.

Figure 1E:
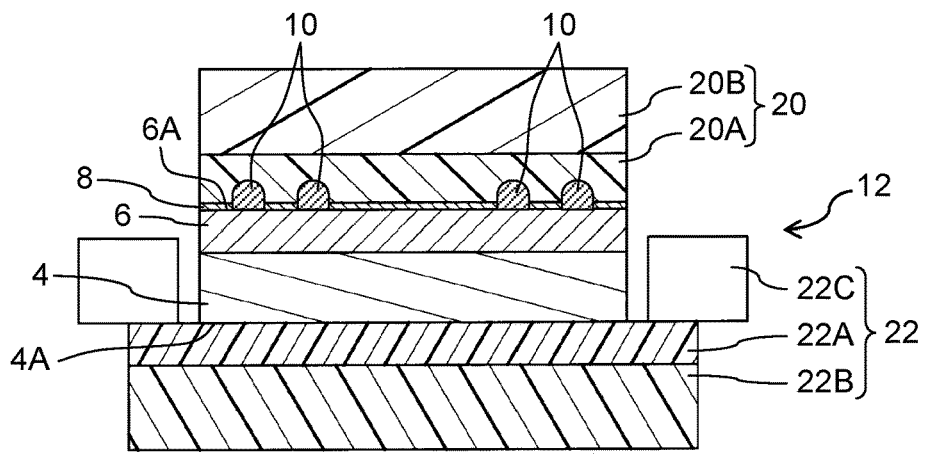
FIG. 1E is a sectional view illustrating a first holding step of the element chip manufacturing method according to the embodiment.

In first holding step as illustrated in FIG. 1E, dicing tape (holding sheet) 22 is attached to rear surface 4A of semiconductor wafer 12. Dicing tape 22 of the embodiment is a holding film which is formed of adhesive layer 22A formed of an acrylic adhesive and resin substrate layer 22B. Adhesive layer 22A is attached to rear surface 4A of semiconductor wafer 12, and semiconductor wafer 12 is held by substrate layer 22B. Frame 22C is attached to dicing tape 22 from the viewpoint of the handling properties.

Figure 1F:
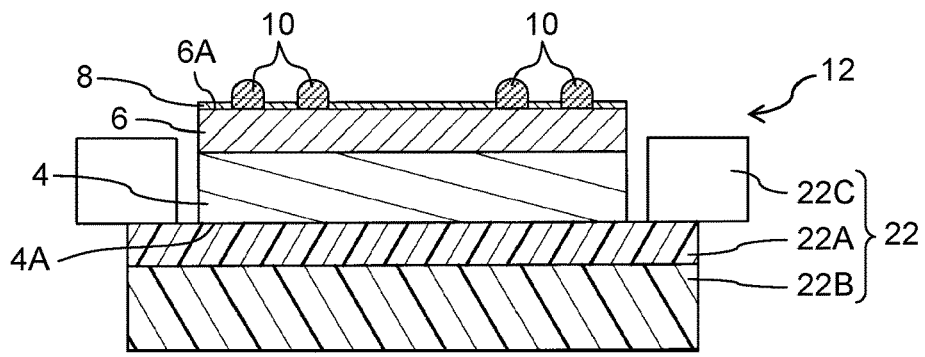
FIG. 1F is a sectional view illustrating a second holding step of the element chip manufacturing method according to the embodiment.

In the second holding step as illustrated in FIG. 1F, BG tape 20 is peeled off from semiconductor wafer 12 to be removed. In a state where BG tape 20 is removed, bump 10 is exposed to surface 6A of semiconductor wafer 12.

Figure 1G:
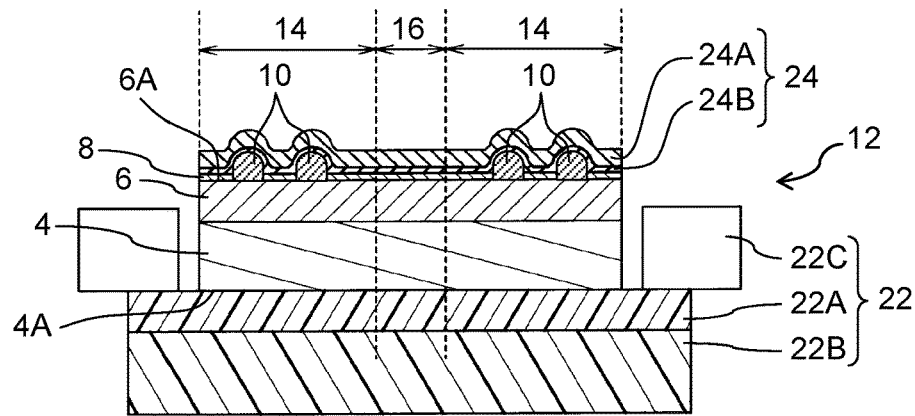
FIG. 1G is a sectional view illustrating a first mask forming step of the element chip manufacturing method according to the embodiment.

In the mask forming step as illustrated in FIG. 1G, mask 24 with plasma resistance is formed on surface 6A of semiconductor wafer 12. In a case where a process is performed by laser grooving in a patterning step described below, mask 24 prevents debris generated by the process from adhering directly to the surface of the element. Also it prevents the surface of the element from being exposed to plasma when plasma dicing is performed in the singulating step described later. Mask 24 of the embodiment is formed of a novolak resin and includes resist film 24A which is a positive resist in which the dissolution rate into the developer, which will be described later, is increased by irradiation with ultraviolet rays, and UV absorbing film 24B which is formed under resist film 24A and absorbs ultraviolet rays. Since the novolak resin has a property of easily peeling off by alkali washing, resist film 24A is easily removed by the developer in a second washing step described below. Since resist film 24A is a positive resist, the solubility is increased by UV re-irradiation before peeling off in the second washing step described below, and the peeling-off is likely to occur. Preferably, the novolak resin contains additives for increasing the absorption rate of UV (355 nm) in order to improve the processability of laser grooving.

Mask 24 is not limited to the novolak resin, and for example, may be a water-soluble resin such as polyvinyl alcohol (PVA). A method of forming mask 24 may be any method such as a spin coating method and a spray coating method.

Formation of mask 24 by the spray coating method can be carried out as follows. First, as a raw material liquid of mask 24, for example, a raw material liquid in which a resist solution AZ6124 and methyl ethyl ketone (MEK) prepared by Merck KGaA are mixed at a ratio of 1:2 is prepared. The surface of semiconductor wafer 12 is scanned while discharging the raw material liquid from the nozzle of the spray coater such that the surface of semiconductor wafer 12 is coated with the resist film. After coating the surface with the resist film, the substrate is heated to dry the resist film. For example, mask 24 having a thickness of about 5 μm can be formed by forming a resist film under spray conditions with a discharge speed of 6 μL/sec and a scan speed of 150 mm/sec, and then heating semiconductor wafer 12 at 90° C.

for two minutes. If necessary, it is possible to form thick mask 24 by repeating spray coating and drying twice or more.

Mask 24 may be a two-layer structure having a water-soluble resin layer and a novolak resin layer. In this case, the debris removability in the patterning step described below is enhanced. That is, the water-soluble resin and the debris (mashing chips) can be removed by washing with water, and then the novolak resin can be left as mask 24. It is preferable that a UV absorption layer (bottom anti-reflective coating: BARC) such as UV absorbing film 24B is provided under the novolak resin. That is, at this time, mask 24 has a three-layer structure of a water-soluble resin layer, novolak resin layer, and a BARC layer. The UV absorbing layer absorbs UV, and thus damages caused by UV irradiation to the element during plasma dicing and light ashing can be suppressed.

Figure 1H:
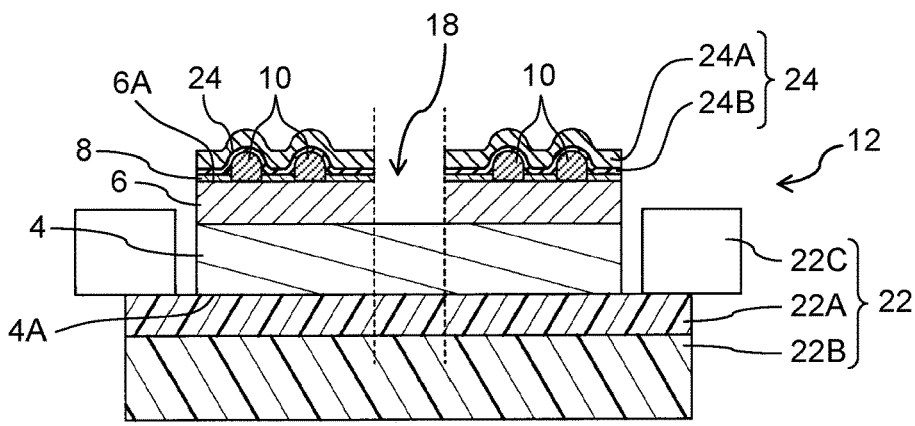
FIG. 1H is a sectional view illustrating a second mask forming step of the element chip manufacturing method according to the embodiment.

In the patterning step as illustrated in FIG. 1H, in a portion corresponding to dividing region 16 (refer to FIG. 1G), mask 24 and semiconductor wafer 12 are cut by laser grooving, mechanical dicing or the like to form exposed portion 18. Specifically, exposed portion 18 is formed by cutting wiring layer 6, protective film 8, and mask 24, and at this time, semiconductor layer 4 may be partially cut, or may not be cut, but is not completely cut. Specifically, insulating film 6C and metal layer 6E (TEG) as illustrated in FIG. 1N are provided in wiring layer 6; however, these are also removed with a laser or the like so as to form exposed portion 18.

The process of the laser grooving can be performed as follows. As a laser light source, a nanosecond laser with UV wavelength (for example, 355 nm) is used. Then, the irradiation of the laser light to dividing region 16 is performed twice at a pulse period of 40 kHz, an output of 0.3 W, the scanning speed of 200 mm/sec so as to remove mask 24. Thereafter, the irradiation of the laser light to dividing region 16 is performed once at a pulse period of 25 kHz, an output of 1.7 W, the scanning speed of 100 mm/sec so as to remove protective film 8 and wiring layer 6. When the laser irradiation for removing mask 24 is performed twice under the low output conditions, it is possible to prevent mask 24 from being peeled off (delamination) from the substrate. When the laser irradiation for removing wiring layer 6 is performed under the high output conditions, it is possible to remove wiring layer 6 even in a case where wiring layer 6 includes TEG formed of Cu.

Figure 5:
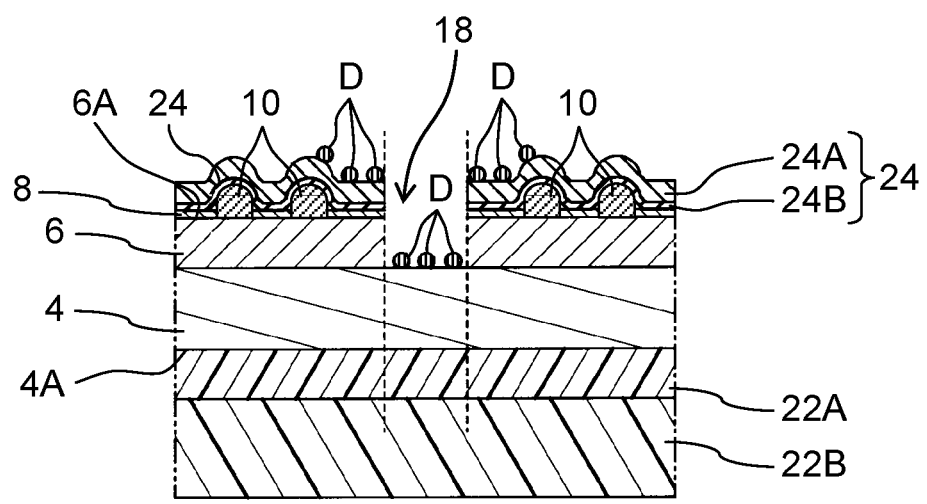
FIG. 5 is a schematic view illustrating an adhering state of debris.

At this time, as illustrated in FIG. 5, laser machining chips (debris) D may be attached to exposed portion 18 or surface 6A of semiconductor wafer 12 by the laser grooving. Specifically, when metal layer (TEG) 6E, insulating film 6C (PI, PBO, SiN, $SiO_2$, low-k), and the like are processed by the laser grooving, the laser machining chips (debris) D may be generated, and debris D includes TEG metal, Si, SiOx, and the like. Accordingly, melted debris D is attached to exposed portion 18, or scattered debris D is attached to the surface of mask 24. Particularly, debris is likely to be attached to a portion where TEG metal is large and in the vicinity thereof. Debris D attached to the surface of mask 24 by the laser grooving causes a micro mask in a subsequent plasma dicing step. In contrast, as described above, by applying the two-layer structure of the water-soluble resin layer and the novolak resin layer, it is possible to remove the water-soluble resin and the debris (mashing chips) by washing with water. Since the novolak resin is not dissolved in water, after washing with water, the novolak resin can be left as mask 24. In this way, when the debris is removed, it is possible to suppress roughening of the surface of mask 24 by the plasma dicing step and to prevent metal components from being attached to the inner wall of chamber 52 (refer to FIG. 2) during the plasma dicing, as described below. Since the metal component is prevented from being attached to the inner wall of chamber 52, it is possible to improve the stability of the plasma dicing process. The washing is preferably performed with warm water, is more preferably performed by bubbling nitrogen in order to increase the residue removal efficiency. For drying, blow drying with nitrogen or air drying by spinning can be performed.

The two-layer structure of the water-soluble resin layer and the novolak resin layer may be formed, for example, by forming the novolak resin layer by the above-mentioned spray coating method and then forming a water-soluble resist by the spin-coating. As the spin coating conditions of the water-soluble resist, for example, the water-soluble resist may be applied once at a rotation speed of 500 rpm. Regarding the washing at the time of using the two-layer structure of the water-soluble resin layer and the novolak resin layer, two-fluid washing may be performed for about 60 seconds while discharging water and nitrogen from the nozzle at 400 mL/min. Accordingly, when semiconductor wafer 12 is viewed from surface 6A side, semiconductor layer 4 is exposed in exposed portion 18. It is preferable that it is possible to suppress the mask peeling (delamination) at the time of laser grooving by adding the additive for increasing the UV absorption rate to resist film 24A which is a novolak resin layer. Alternatively, a configuration in which exposing and developing processes are performed on mask 24 to form an opening on a portion corresponding to dividing region 16 of mask 24, and then, protective film 8 and wiring layer 6 are etched so as to form exposed portion 18 may be employed.

Figure 1I:
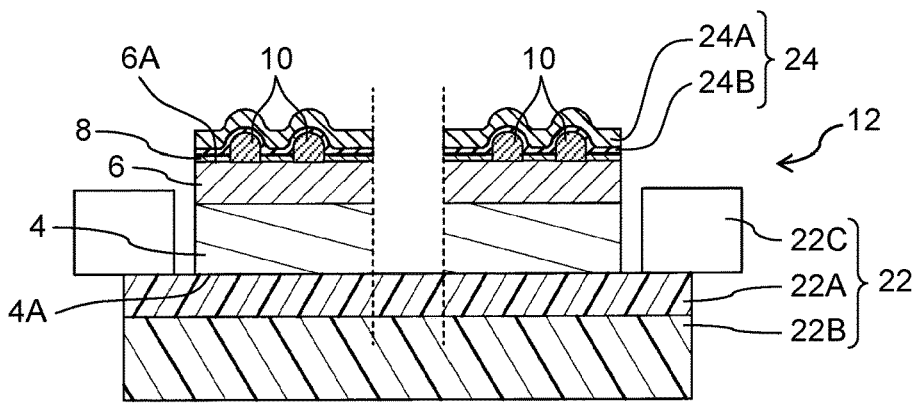
FIG. 1I is a sectional view illustrating a singulating step of the element chip manufacturing method according to the embodiment.
Figure 1J:
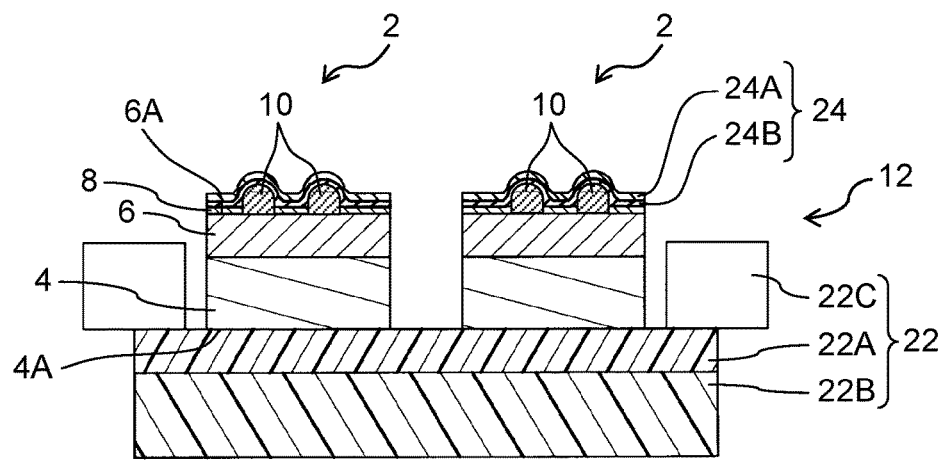
FIG. 1J is a sectional view illustrating a first mask removing step of the element chip manufacturing method according to the embodiment.
Figure 2:
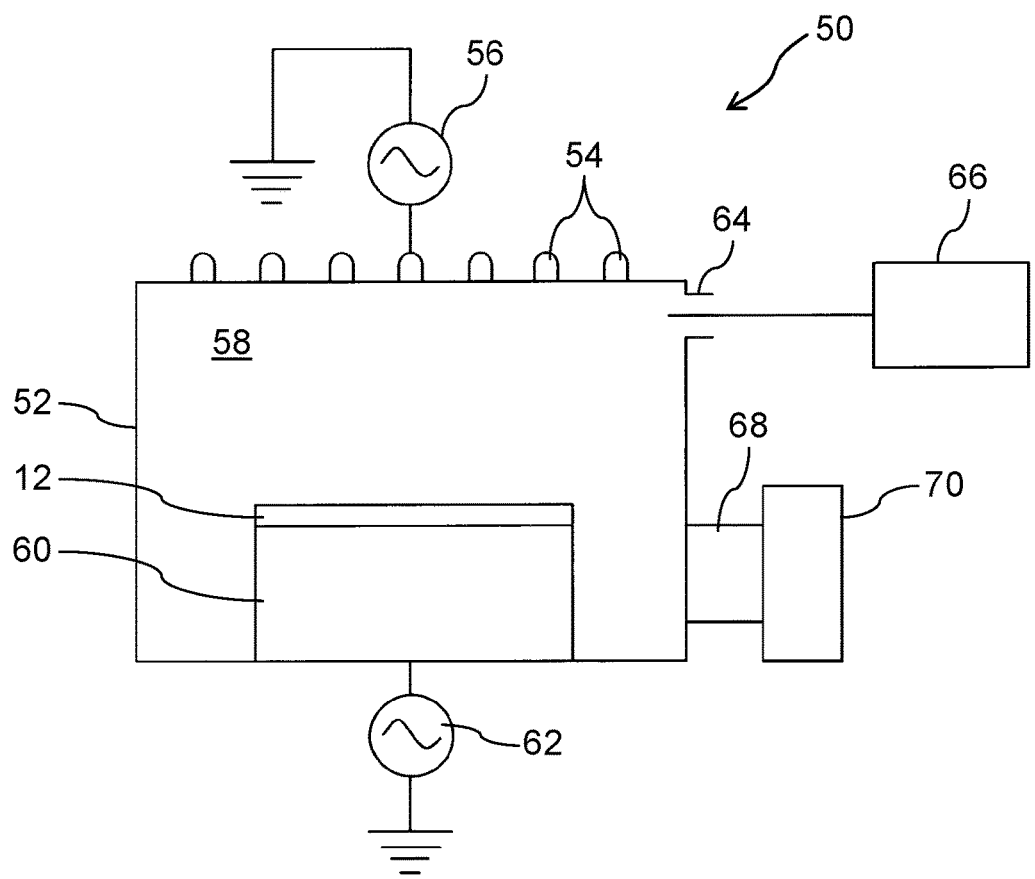
FIG. 2 is a schematic view of a dry etching apparatus.

In the singulation (plasma dicing) step as illustrated in FIG. 1I and FIG. 1J, semiconductor wafer 12 is singulated by plasma etching (plasma dicing) in a state of holding rear surface 4A of semiconductor wafer 12 by dicing tape 22. At this time, as described above, melted debris such as metal, insulator, and Si is attached to exposed portion 18 exposed by the laser grooving. In that case, due to the debris, the surface of mask 24 may be roughened or the surface of mask 24 may be hardened by plasma. Therefore, the melted matter is preferably removed by plasma etching a street portion under conditions with strong ionicity before the singulation. In this way, it is possible to remove the debris, the melted metal component, or the like attached to exposed portion 18, and thereby it is possible to prevent the columnar residue and the etching stop caused by the subsequent plasma dicing, improve the processed shape, and improve the process stability. FIG. 2 illustrates an example of dry etching apparatus 50 used in the present process. A dielectric window (not shown) is provided on the top part of chamber 52 of dry etching apparatus 50 and antenna 54 is disposed above the dielectric window as an upper electrode. Antenna 54 is electrically connected with first high frequency power source 56. On the other hand, stage 60, on which semiconductor wafer 12 is disposed, is disposed at the bottom side of processing chamber 58 within chamber 52. A coolant channel (not shown) is formed in stage 60, and stage 60 is cooled by circulating the coolant in the coolant channel. Stage 60 also functions as a lower electrode and is electrically connected to second high frequency power source 62. Stage 60 includes an electrode for electrostatic suction (ESC electrode) which is not shown and is able to electrostatically suck dicing tape 22 (that is, semiconductor wafer 12) disposed on stage 60. Stage 60 is provided with a hole for cooling gas which is not shown for supplying cooling gas and cooling gas such as helium is supplied from the hole for cooling gas so as make it possible to cool down semiconductor wafer 12 electrostatically sucked on stage 60. Gas introduction port 64 of chamber 52 is fluidally connected to etching gas source 66 and exhaust port 68 is connected to vacuum exhaust unit 70 including a vacuum pump for evacuating the inside of chamber 52.

In the singulating step, semiconductor wafer 12 is placed on stage 60 via dicing tape 22, the inside of processing chamber 58 is evacuated by vacuum exhaust unit 70 and etching gas which is, for example, $SF_6$ is supplied into processing chamber 58 from etching gas source 66. Then, processing chamber 58 is maintained at predetermined pressure, and high-frequency power is supplied from first high frequency power source 56 to antenna 54 to generate first plasma in processing chamber 58 so as to allow semiconductor wafer 12 to be irradiated with plasma. At this time, semiconductor layer 4 of semiconductor wafer 12 exposed in exposed portion 18 is removed by a physicochemical action of radicals and ions within the first plasma. Through this singulating step, semiconductor wafer 12 is formed on each individual semiconductor chip 2.

More specifically, the singulating step may include (1) chucking step, (2) cleaning step, (3) surface oxide removing step, (4) plasma dicing step, (5) $SiO_2$ etching step, (6) light ashing step, and (7) dechucking step.

(1) Chucking Step

In the chucking step, low energy plasma is generated before high energy plasma is generated in chamber 52, and semiconductor wafer 12 and dicing tape 22 placed on stage 60 are electrostatically sucked onto stage 60 with certainty. With this, dicing tape 22 lack of the heat the resistance is less likely to be susceptible to thermal damage in accordance with the plasma process. For example, weak plasma may be generated for about 10 seconds by adjusting the chamber pressure to be 8 Pa while supplying Ar gas at 100 sccm, and applying 150 W of RF power to antenna 54. At this time, it is possible to cool semiconductor wafer 12 and dicing tape 22 by applying a DC voltage of 3 kV to ESC electrode and supplying He of 50 to 200 Pa as a cooling gas between dicing tape 22 and stage 60 while adjusting the temperature of stage 60° C. to 20° C. or lower.

(2) Cleaning Step

In the cleaning step, debris generated by the laser grooving and an amorphous silicon layer or a silicon oxide layer generated by melting Si by the laser grooving are removed by plasma. It is preferable to use a gas type capable of removing silicon and silicon oxide layer as the plasma used in the cleaning step, for example, the silicon and silicon oxide layer may be exposed to the plasma generated by adjusting the chamber pressure to be 5 Pa while supplying a mixed gas of $SF_6$ and $O_2$ at 200 sccm, and applying RF power in a range of 1000 to 2000 W to antenna 54 for 1 to 2 minutes. At this time, by applying LF power of about 150 W to the lower electrode of stage 60, the clean effect can be enhanced. In order to reduce the thermal damage caused by the plasma generated in the cleaning step, semiconductor wafer 12 and dicing tape 22 are preferably cooled in the cleaning step. For example, it is possible to cool semiconductor wafer 12 and dicing tape 22 by applying a DC voltage of 3 kV to ESC electrode and supplying He of 50 to 200 Pa as a cooling gas between dicing tape 22 and stage 60 while adjusting the temperature of stage 60° C. to 20° C. or lower.

(3) Surface Oxide Removing Step

In a case where cleaning is performed by oxygen-containing plasma in the cleaning step, the surface of the silicon after cleaning may be oxidized. A surface oxide removing step may be provided in order to remove the oxide film layer on the silicon surface generated in the cleaning step. It is preferable to use a gas type capable of removing the silicon oxide layer as the plasma used in the surface oxide removing step, for example, the silicon and silicon oxide layer may be exposed to the plasma generated by adjusting the chamber pressure to be 8 Pa while supplying $SF_6$ at 200 sccm, and applying RF power in a range of 2000 to 5000 W to antenna 54 for 2 to 10 seconds. At this time, by applying LF power of about 500 W to the lower electrode of stage 60, the surface oxide removal effect can be enhanced. In order to reduce the thermal damage caused by the plasma generated in the surface oxide removing step, semiconductor wafer 12 and dicing tape 22 are preferably cooled in the surface oxide removing step. For example, it is possible to cool semiconductor wafer 12 and dicing tape 22 by applying a DC voltage of 3 kV to ESC electrode and supplying He of 50 to 200 Pa as a cooling gas between dicing tape 22 and stage 60 while adjusting the temperature of stage 60° C. to 20° C. or lower.

(4) Plasma Dicing Step

In the plasma dicing step, semiconductor layer 4 formed of silicon is removed by a BOSCH method. In the BOSCH method, a plasma for depositing a protective film and a plasma for etching silicon are alternately generated. For example, the plasma for depositing the protective film may be generated for about 5 to 20 seconds by adjusting the chamber pressure to be 20 Pa while supplying C4F8 at 300 sccm, and applying RF power in a range of 2000 to 5000 W to antenna 54. The plasma for etching silicon may be generated for about 5 to 20 seconds by adjusting the chamber pressure to be 20 Pa while supplying $SF_6$ at 600 sccm, and applying RF power in a range of 2000 to 5000 W to antenna 54 and applying LF power in a range of 50 to 500 W to the lower electrode. In order to suppress the notching in the processed shape of semiconductor layer 4, the RF power applied to the lower electrode may be pulsed. Semiconductor layer 4 can be removed by repeating such a plasma for depositing the protective film and a plasma for etching the silicon, for example, about 20 cycles. In order to reduce the thermal damage caused by the plasma generated in the cleaning step, semiconductor wafer 12 and dicing tape 22 are preferably cooled in the plasma dicing step. For example, it is possible to cool semiconductor wafer 12 and dicing tape 22 by applying a DC voltage of 3 kV to ESC electrode and supplying He of 50 to 200 Pa as a cooling gas between dicing tape 22 and stage 60 while adjusting the temperature of stage 60° C. to 20° C. or lower. Note that, in a case where semiconductor layer 4 has a predetermined thickness or less, silicon may be continuously etched without using the BOSCH method.

(5) $SiO_2$ Etching Step

In a case where semiconductor wafer 12 includes $SiO_2$ or DAF in the lower layer of semiconductor layer 4, these $SiO_2$ and DAF may be processed by switching etching conditions after the plasma dicing step. It is preferable to use a gas type capable of removing silicon and silicon oxide layer as the plasma used in $SiO_2$ etching step, for example, a silicon oxide layer may be exposed to the plasma generated by adjusting the chamber pressure to be 1 Pa while supplying a mixed gas of Ar and $C_4F_8$ at 300 sccm, and applying RF power in a range of 500 to 2000 W to antenna 54 for 2 to 8 minutes. At this time, by applying LF power in a range of 500 to 1500 W to the lower electrode of stage 60, $SiO_2$ etching effect can be enhanced. In order to reduce the thermal damage caused by the plasma generated in the $SiO_2$ etching step, semiconductor wafer 12 and dicing tape 22 are preferably cooled in the $SiO_2$ etching step. For example, it is possible to cool semiconductor wafer 12 and dicing tape 22 by applying a DC voltage of 3 kV to ESC electrode and supplying He of 50 to 200 Pa as a cooling gas between dicing tape 22 and stage 60 while adjusting the temperature of stage 60° C. to 20° C. or lower.

(6) Light Ashing Step

The outermost layer of mask 24 after the plasma dicing step may be hardened by plasma irradiation or ion incidence. In this case, after the plasma dicing step, a light ashing step (first mask removing step) for hardening an outermost layer of resist and an alteration layer may be performed.

In the first mask removing step as illustrated in FIG. 1J, the inside of processing chamber 58 illustrated in FIG. 2 is evacuated by the vacuum exhaust unit 70 and the etching gas containing oxygen, for example, is supplied from the etching gas source 66 into the processing chamber 58. Then, processing chamber 58 is maintained at predetermined pressure, and high-frequency power is supplied from first high frequency power source 56 to antenna 54 to generate second plasma in processing chamber 58 so as to allow semiconductor wafer 12 to be irradiated with plasma, and the surface of mask 24 is exposed by the second plasma. At this time, mask 24 is partially removed (light ashing) by a physico-chemical action of radicals and ions within the second plasma. In the present embodiment, as seen from that the thickness of mask 24 is thinner in FIG. 1J as compared with FIG. 1I and FIG. 1J, mask 24 is not completely but partially removed by the light ashing. With this, mask 24 is likely to be removed in the second mask removing step described below.

Furthermore, in order to remove the remaining film and debris of mask 24 by ashing, it is preferable to add a reactive gas such as $CF_4$ to an ashing gas, and to increase the effect of removing Si, SiOx, and mask hardened layer. It is preferable to perform the plasma etching under the condition of increasing Bias power so as to enhance ionicity (sputtering property) in order to remove the metal component. It is preferable to use a gas type capable of hardening an outermost layer of resist and an alteration layer as the plasma used in the light ashing step, for example, a silicon oxide layer may be exposed to the plasma generated by adjusting the chamber pressure to be 1 Pa while supplying a mixed gas of O2 and $CF_4$ at 300 sccm, and applying RF power in a range of 2000 to 5000 W to antenna 54 for 1 to 3 minutes. At this time, by applying LF power of about 100 W to the lower electrode of stage 60, the light ashing effect can be enhanced. In order to reduce the thermal damage caused by the plasma generated in the light ashing step, semiconductor wafer 12 and dicing tape 22 are preferably cooled in the surface oxide removing step. For example, it is possible to cool semiconductor wafer 12 and dicing tape 22 by applying a DC voltage of 3 kV to ESC electrode and supplying He of 50 to 200 Pa as a cooling gas between dicing tape 22 and stage 60 while adjusting the temperature of stage 60° C. to 20° C. or lower.

(7) Dechucking Step

In dechucking step, weak plasma is generated in chamber 52, residual charges are removed from semiconductor wafer 12 and dicing tape 22 which are electrostatically attracted to stage 60, and electrostatic chucking force with stage 60 is reduced. For example, weak plasma may be generated for about 30 to 120 seconds by adjusting the chamber pressure to be 12 Pa while supplying Ar gas at 100 sccm, and applying 150 W of RF power to antenna 54. At this time, it is preferable to stop applying the voltage to the ESC electrode and the supplying of the cooling gas while adjusting the temperature of stage 60° C. to be 20° C. or lower, so as to generate weak plasma.

Figure 1K:
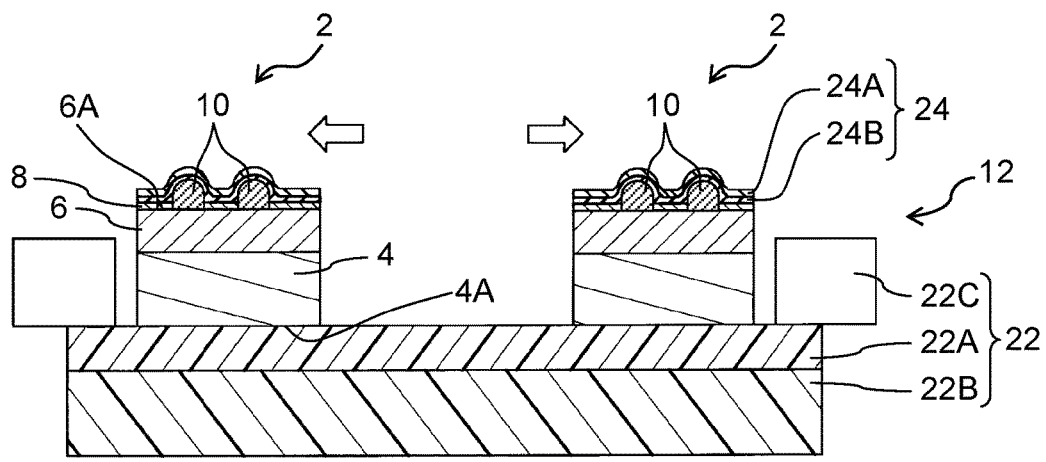
FIG. 1K is a sectional view illustrating an expanding step of the element chip manufacturing method according to the embodiment.
Figure 3:
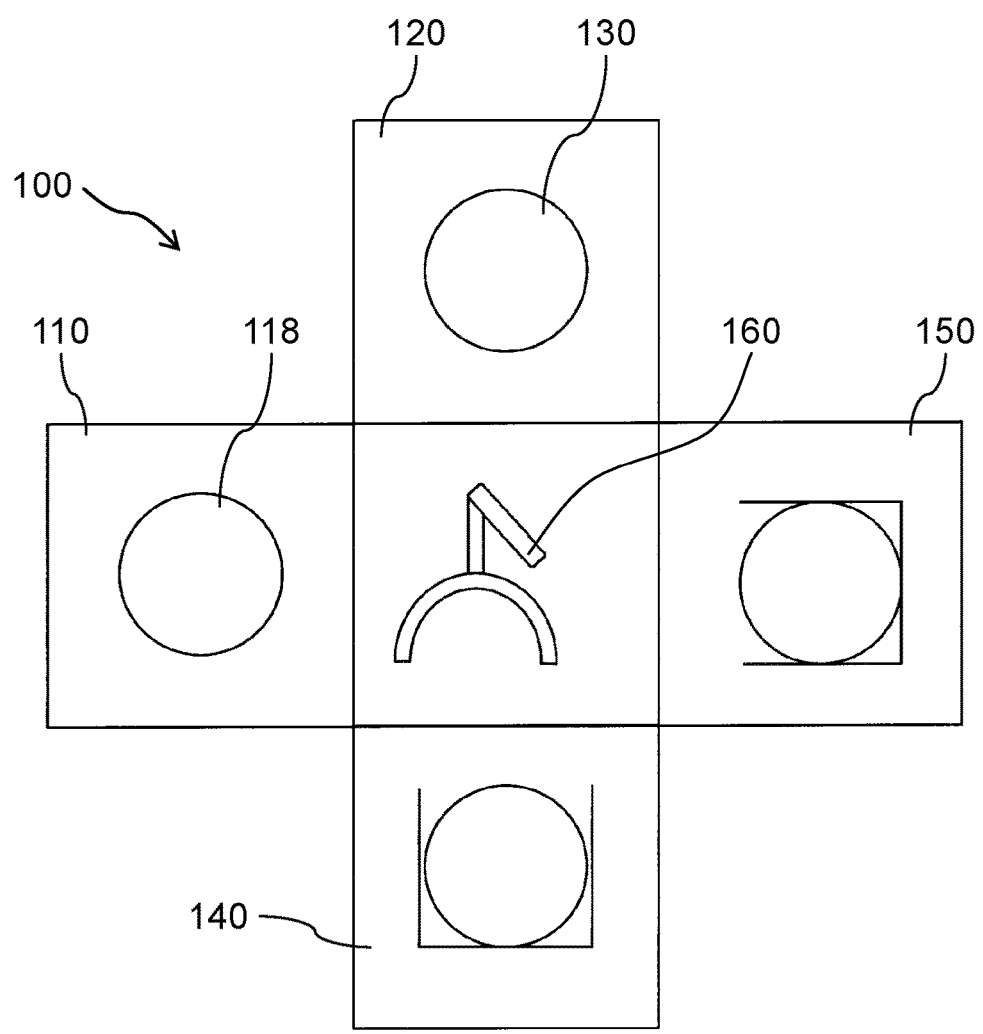
FIG. 3 is a schematic sectional view of a mask removing apparatus.

In the expanding step as illustrated in FIG. 1K, an interval between semiconductor chips 2 is expanded. In the embodiment, as illustrated in FIG. 3, expanding device 110, first cassette mounting portion 140, second cassette mounting portion 150, and transport mechanism 160 for transporting semiconductor wafer 12 therebetween are provided.

Semiconductor wafer 12 is placed in first cassette mounting portion 140 after the processing of the first mask removing step and before the processing of the second mask removing step described later. Semiconductor wafer 12 transported from first cassette mounting portion 140 to expanding device 110 by transport mechanism 160.

Figure 4A:
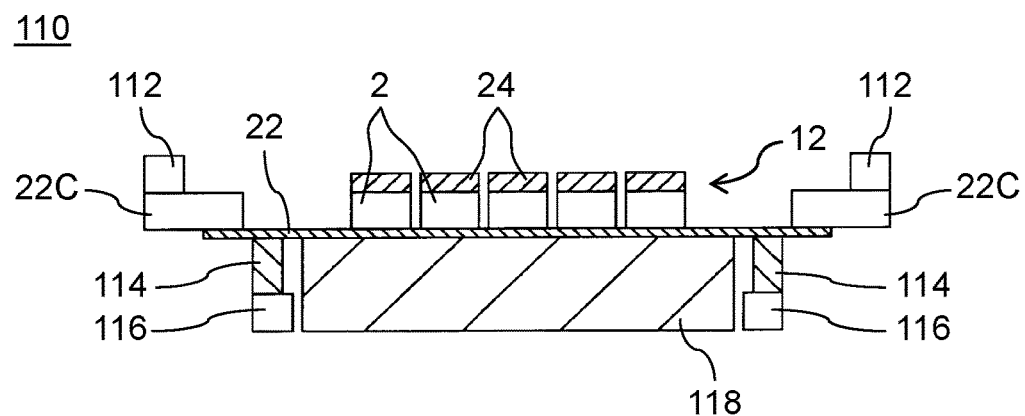
FIG. 4A is a first sectional view an expanding step.

Expanding device 110 is a device for expanding the interval between semiconductor chips 2. As illustrated in FIG. 4A, in semiconductor wafer 12 after the first mask removing step, the interval between the semiconductor chips 2 is narrow, for example, the interval is about 20 µm. When the interval is narrow, there is also a possibility of adversely affecting the handling of semiconductor chip 2. Therefore, as illustrated in FIG. 4B, in the present embodiment, the interval between semiconductor chips 2 is expanded by expanding device 110.

Figure 4B:
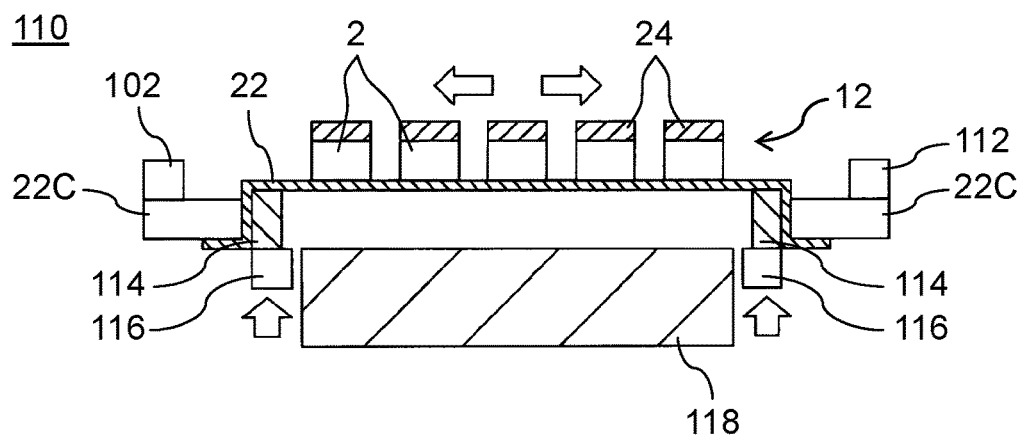
FIG. 4B is a second sectional view illustrating an expanding step.

As illustrated in FIG. 4B, in the embodiment, an expanding process of pulling dicing tape 22 toward the outside so as to expand the interval between semiconductor chips 2 after the singulating step and before removing mask 24 from semiconductor chip 2 with the chemicals described below. Expanding device 110 that performs the expanding process is provided with pressing member 112, ring member 114, elevator 116, and placing table 118. Pressing member 112 is disposed along frame 22C of dicing tape 22, and is fixed to frame 22C. Ring member 114 is a ring-shaped member and is disposed concentrically with frame 22C below dicing tape 22, and raises and lowers dicing tape 22 with respect to frame 22C. Elevator 116 raises and lowers ring member 114. In the process in expanding device 110, semiconductor wafer 12 is placed on placing table 118, and dicing tape 22 is floated from placing table 118 by elevator 116 in a state where frame 22C of dicing tape 22 is pressed and fixed by pressing member 112 so as to raise and lower ring member 114. At this time, since dicing tape 22 is stretched, the interval between semiconductor chips 2 is expanded, and the interval therebetween is, for example, about 50 µm. If the second mask removing step described below is performed in a state where exposed portion 18 is as narrow as about 20 µm, adjacent semiconductor chips 2 are attracted and collide with each other by the surface tension, and thus the cleaning liquid may not enter between the chips. Therefore, in the embodiment, the above problem is prevented by the expanding processing.

As illustrated in FIG. 3, after the expanding process, semiconductor wafer 12 is transported to mask removing apparatus 120 from expanding device 110 by transport mechanism 160 in a state of being expanding processed. In mask removing apparatus 120, the following second mask removing step is performed.

Figure 1L:
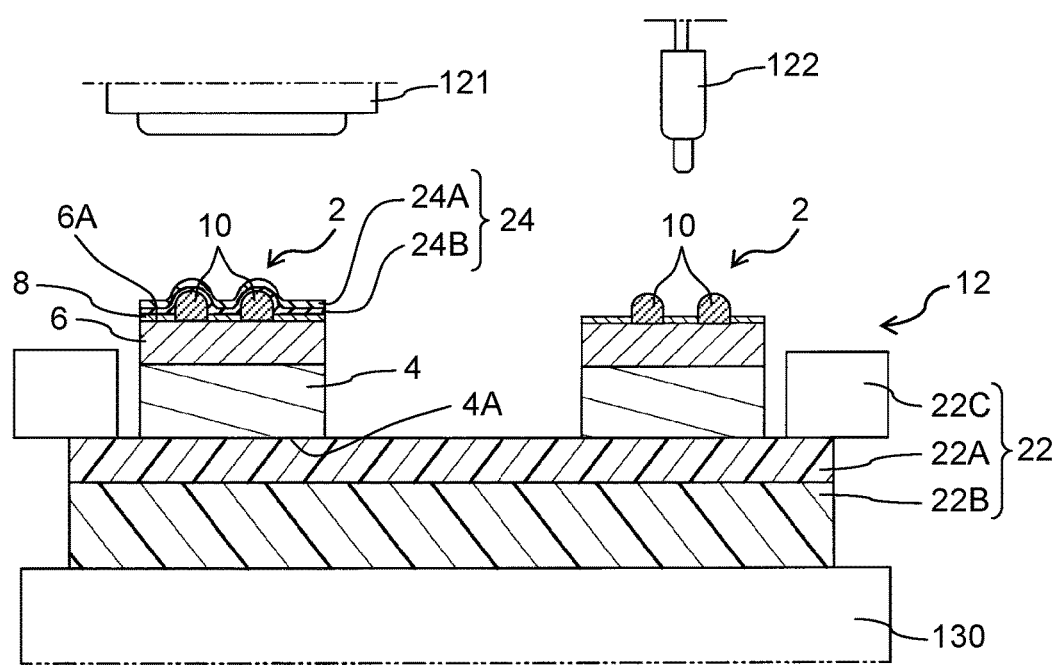
FIG. 1L is a sectional view illustrating a second mask removing step of the element chip manufacturing method according to the embodiment.
Figure 1M:
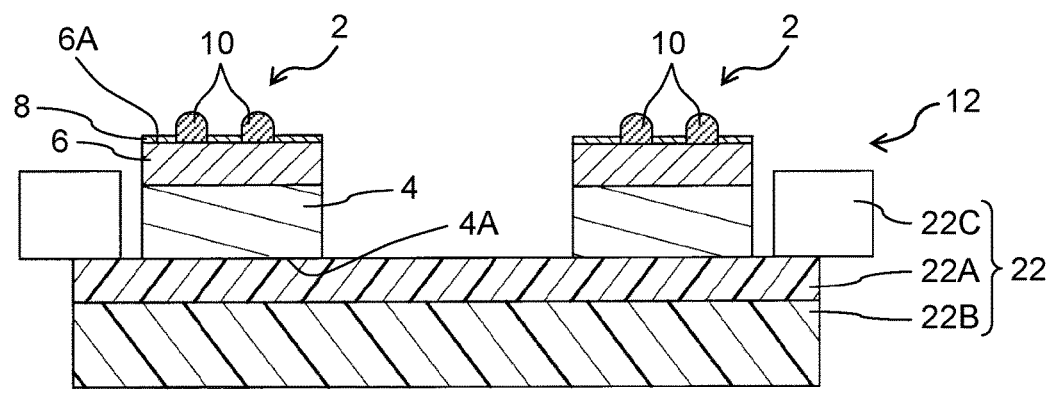
FIG. 1M is a sectional view of the element chip manufactured by the element chip manufacturing method according to the embodiment.
Figure 1N:
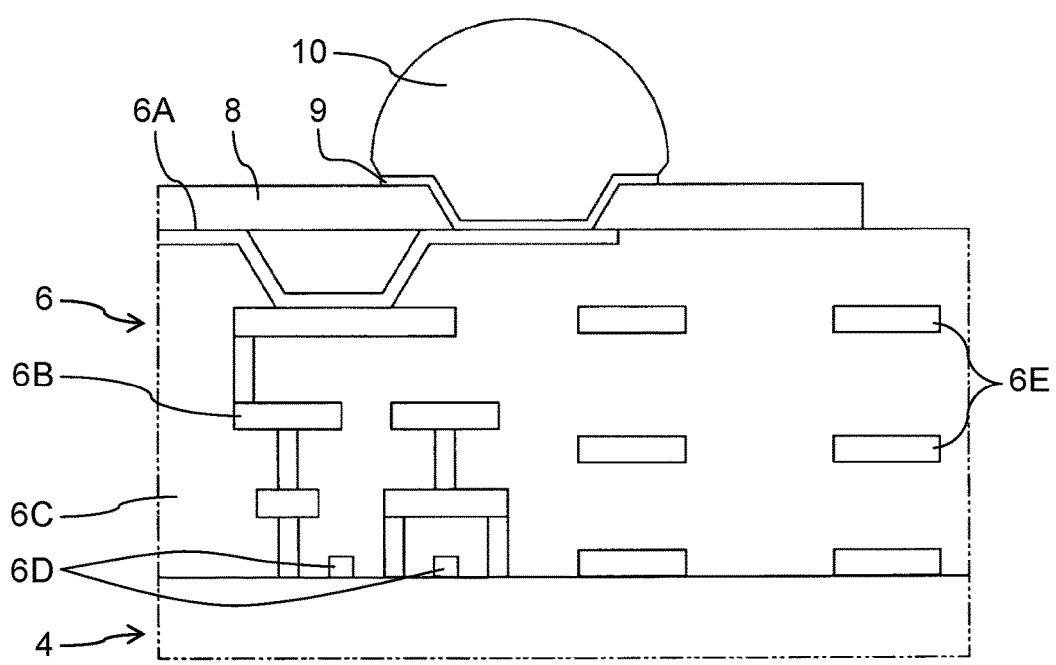
FIG. 1N is a partial enlarged sectional view illustrating details of FIG. 1M.

In the second mask removing step as illustrated in FIG. 1L, mask 24 is removed by using mask removing apparatus 120. Mask removing apparatus 120 includes irradiation device 121 that irradiates ultraviolet rays, dropping device 122 that drips an alkaline developer (also simply referred to as a developer) that is an example of chemicals that dissolve mask 24, and rotating stage 130 having a rotating function. Here, as the developer, a type in which the dissolution rate of mask 24 is higher than the dissolution rate of adhesive layer 22A is used, and for example, tetramethyl ammonium hydroxide (TMAH) is used. TMAH can remove mask 24 at a low temperature, and thus is preferable as a developer for performing alkali cleaning. However, TMAH dissolves metals (Al, Cu, Ni, solder, and the like) in some cases, and thus is preferably an alkaline developer to which a metal anti-corrosive agent is added. As a result, debris and ashing residue can be removed together with mask 24. In the embodiment, before dissolving mask 24 with the developer, ultraviolet rays are irradiated from irradiating device 121 to denature resist film 24A so as to increase the dissolution rate of resist film 24A into the developer. At this time, the dissolution rate of adhesive layer 22A is not significantly changed. Therefore, it is possible to increase the selectivity which is the dissolution rate of mask 24 with respect to the developer divided by the dissolution rate of adhesive layer 22A with respect to the developer. This increase in selectivity makes it easier to dissolve only mask 24 in the developer while maintaining adhesive layer 22A. The developer is dropped on mask 24 by dropping device 122 at room temperature and then rotates rotating stage 130 to reach the entire mask 24. Alternatively, mask 24 may be immersed in the developer as in the dipping method. In this way, mask 24 can be removed from the semiconductor chip 2 by dissolving mask 24 (alkaline cleaning). In particular, alkali cleaning is performed instead of an organic solvent which is generally used in the field, and the reason for this is that the selectivity with dicing tape 22 does not appear in the organic solvent. Since the alkaline developer dissolves the novolac resin, the mask can be easily removed together with debris and ashing residue by washing. Since the alkaline developer hardly dissolves acrylic or polyolefin constituting dicing tape 22 and PI (polyimide) used for protective film 8 of semiconductor chip 2, it is possible to obtain the surface of clean semiconductor chip 2 without imparting damage to semiconductor chip 2. Preferably, at the time of alkaline cleaning, physical effect such as nitrogen bubbling (foam) or ultrasonic vibration is added to promote residue removal. Preferably, when a metal anticorrosive agent is added to the alkaline developer, it is possible to suppress the metal corrosion of the surface of semiconductor chip 2.

As the Conditions of Alkaline Cleaning

The alkali washing can be performed, for example, by using a cleaning liquid containing about 3.3% by weight of TMAH as an alkaline component and water, a metal corrosion inhibitor, a surfactant and the like as the other components. The concentration of TMAH is preferably in a range of 2% to 4% by weight. Further, the cleaning liquid may further contain an organic alkali as the other components. Further, a cleaning liquid containing an organic alkali as an alkaline component, and water, a metal anticorrosive agent, a surfactant, and the like as other components may be used. At the time of washing, two-fluid washing may be performed for about 60 seconds while discharging the cleaning liquid and $N_2$ gas from the nozzle.

After washing with alkali, washing with water and drying are performed. In the drawings, irradiation device 121 and dropping device 122 are larger enough to process semiconductor chips 2 one by one, but from the viewpoint of efficiency, each of them is preferably large enough to process the entire surface of semiconductor wafer 12. As the irradiation condition of the ultraviolet rays from irradiation device 121, for example, irradiation with an energy density of 1.5 $W/cm^2$ for two seconds may be performed.

As illustrated in FIG. 3, semiconductor wafer 12 from which mask 24 is removed by the mask removing apparatus 120 is transported to second cassette mounting portion 150 from mask removing apparatus 120 by transport mechanism 160. Accordingly, semiconductor wafer 12 (refer to FIG. 1M) after mask 24 is completely removed is placed in second cassette mounting portion 150.

According to the embodiment, at the time of removing mask 24, it is difficult for the residue of mask 24 to remain, and damage to semiconductor chip 2 that occurs during ashing can be suppressed. That is, the ashing failure can be suppressed, and the productivity of semiconductor chip 2 can be improved. Specifically, in the above method, mask 24 is removed with alkaline chemicals. Therefore, the damage to semiconductor chip 2 can be reduced, and thus the ashing failure can be suppressed. In addition, since the alkaline chemicals having a dissolution rate of mask 24 higher than the dissolution rate of adhesive layer 22A are used, mask 24 can be melted first while maintaining adhesive layer 22A.

According to the embodiment, resist film 24A of mask 24 is dissolved by the alkaline developer of chemicals faster than the acrylic adhesive of adhesive layer 22A. In particular, resist film 24A is a positive resist, and thus it is possible to easily increase the selectivity as described above by irradiating ultraviolet rays.

According to the embodiment, ultraviolet rays can be absorbed by UV absorbing film 24B, so that it is possible to reduce damage to element chip 2 due to ultraviolet rays irradiated at the time of increasing the selectivity.

According to the embodiment, each semiconductor chip 2 is likely to be handled by stretching dicing tape 22 to expand the interval between semiconductor chips 2 (expanding process), and thereby it is possible to reliably coat each semiconductor chip 2 with chemicals. If the interval between the semiconductor chips 2 is narrow, the chemicals may not penetrate between the element chips 2 due to the surface tension.

However, this problem can be prevented by performing the expanding process as described above.

With this, although the specific embodiments of the disclosure have been described above, the disclosure is not limited to the above-described embodiments, and various modifications can be made within the scope of the disclosure.

For example, irradiation device 121 in the second mask removing step (refer to FIG. 1L) is not indispensable, and the irradiation of the ultraviolet rays is not necessarily performed. This is because the selectivity can be increased by irradiating mask 24 with ultraviolet rays radiated by at least one of the first plasma generated in the singulation step and the second plasma in the light ashing. That is, the selectivity may be increased at least one of the singulation step and the light ashing step.

In this way, it is possible to easily increase the selectivity without providing irradiation device 121 of the ultraviolet rays. By using a generally used positive resist, it is possible to form semiconductor chip 2 with less damage by the residue of mask 24 or plasma.

UV absorbing film 24B may not be provided. In the embodiment, as an example of a method for increasing the selectivity, a method of irradiating mask 24 with ultraviolet rays is employed, but a method of increasing the selectivity is not limited to this, but can be changed according to the properties of mask 24. For example, it is conceivable to denature mask 24 by applying heat. In particular, in such a case, since UV absorbing film 24B is unnecessary, UV absorbing film 24B may not be provided.

In addition, the types of dicing tape 22, mask 24, and chemicals are not limited to the above embodiments, and various modifications are conceivable. For example, substrate layer 22B of dicing tape 22 may be formed of polyolefin, and adhesive layer 22A may be formed of an acrylic adhesive. At this time, the entire of mask 24 is not provided with UV absorbing film 24B, but may be formed of a novolak resin.

According to this method, the novolac resin is dissolved by TMAH of the chemicals faster than the acrylic adhesive, and thus mask 24 is dissolved by TMAH of the chemicals faster than adhesive layer 22A. Polyolefin is hardly soluble in TMAH, and the shape of dicing tape 22 can be maintained. Therefore, mask 24 can be reliably removed with the chemicals while maintaining dicing tape 22.

(Conclusion)

An element chip manufacturing method of the present disclosure includes forming a mask on a first face of a substrate including a plurality of element regions and a dividing region for defining the plurality of element regions; exposing the dividing region of the substrate by forming an opening on the mask; holding a second face which faces the first face of the substrate by a holding sheet via an adhesive layer; singulating the substrate into a plurality of element chips by etching the substrate exposed to the opening with a first plasma until the substrate reaches the second face so that the plurality of element chips are held by the holding sheet via the adhesive layer; and removing the mask from the surfaces of the plurality of element chips so that the plurality of element chips from which the mask is removed are held by the holding sheet via the adhesive layer, in which at the time of removing the mask, the mask is removed from the plurality of element chips with alkaline chemicals having a dissolution rate of the mask larger than a dissolution rate of the adhesive layer.

According to the method, at the time of the removing mask, it is difficult for the residue of the mask to remain, and damage to the element chip that occurs during ashing can be suppressed. That is, the ashing failure can be suppressed, and the productivity of the element chip can be improved. Specifically, in the above method, the mask is removed with alkaline chemicals. Therefore, the damage to the element chip can be reduced, and thus the ashing failure can be suppressed. In addition, since the chemicals having the dissolution rate of the mask higher than the dissolution rate of the adhesive layer are used, the mask can be melted first while maintaining the adhesive layer.

The holding sheet is formed of polyolefin, the adhesive layer is formed of an acrylic adhesive, the mask is formed of a novolak resin, and the chemicals may contain tetramethyl ammonium hydroxide.

According to this method, the novolac resin is dissolved by tetramethyl ammonium hydroxide (TMAH) of the chemicals faster than the acrylic adhesive, and thus the mask is dissolved by TMAH of the chemicals faster than the adhesive layer. Polyolefin is hardly soluble in TMAH, and the shape of the holding sheet can be maintained. Therefore, the mask can be reliably removed with the chemicals while maintaining the holding sheet and the adhesive layer.

The chemicals may contain the metal anticorrosive agent.

According to this method, even if metals such as bumps and pad electrodes are exposed to the surface of the element chip after removing the mask with the chemicals, these metals are protected by the metal anticorrosive agent, so that these chemicals are hardly corroded.

Removal of the mask with the chemicals may be performed while irradiating the mask with bubbles or applying ultrasonic vibration to the mask.

According to the method, removal of the mask with the chemicals can be promoted by bubbles or ultrasonic vibration.

Before removing the mask with the chemicals, at least a part of the mask may be removed by exposing the surface of the mask to the second plasma containing oxygen.

According to this method, even in a case where the surface of the mask is hardened by etching with the first plasma, the mask is likely to be removed with the chemicals.

A step of increasing the selectivity may be included before removing the mask from the element chip with the chemicals, wherein the selectivity being the dissolution rate of the mask with respect to the chemicals divided by the dissolution rate of the adhesive layer with respect to the chemicals.

According to this method, the solubility of the mask can be increased by increasing the selectivity, and thereby only the mask can be more reliably removed while maintaining the adhesive layer.

The mask may be formed of a positive resist in which the dissolution rate into the developer is increased by irradiation with ultraviolet rays, the adhesive layer may be formed of an acrylic adhesive, the chemicals includes the developer, and the positive resist may be irradiated with the ultraviolet rays at the time of increasing the selectivity.

According to this method, the positive resist is dissolved by the developer of the chemicals faster than the acrylic adhesive, and thus the mask is dissolved by the developer of the chemicals faster than the adhesive layer. In particular, the mask is a positive resist, and thus it is possible to easily increase the selectivity as described above by irradiating ultraviolet rays.

The mask may further include a UV absorbing film formed under the positive resist.

According to this method, ultraviolet rays can be absorbed by the UV absorbing film, so that it is possible to reduce damage to the element chip due to ultraviolet rays irradiated at the time of increasing the selectivity.

When the mask is irradiated with ultraviolet rays radiated by the first plasma, the selectivity may be increased, during the singulation.

According to this method, it is possible to easily increase the selectivity without providing the irradiation device of the ultraviolet rays. By using a generally used positive resist, it is possible to form the element chip with less damage by the residue of the mask or plasma.

The element chip manufacturing method may include a step of expanding an interval between the plurality of element chips held by the holding sheet via the adhesive layer by stretching the holding sheet after the singulation and before removing the mask from the element chip with the chemicals.

According to the method, each element chip is likely to be handled and it is possible to reliably coat each element chip with chemicals by stretching the holding sheet to expand the interval between element chips. If the interval between the element chips is narrow, the chemicals may not penetrate between the element chips due to the surface tension. However, this problem can be prevented by performing the expanding process as described above.

The method may further include removing at least a part of the mask by exposing the surface of the mask to the second plasma containing oxygen before removing the mask with the chemicals, and at the time of exposing the surface of the mask to the second plasma, when the mask is irradiated with ultraviolet rays radiated from the second plasma, the selectivity may be increased.

According to this method, it is possible to easily increase the selectivity without providing the irradiation device of the ultraviolet rays. By using a generally used positive resist, it is possible to form the element chip with less damage by the residue of the mask or plasma.

What is claimed is:

1. An element chip manufacturing method comprising:
   forming a mask on a first face of a substrate including a plurality of element regions and a dividing region for defining the plurality of element regions;
   exposing the dividing region of the substrate by forming an opening on the mask;
   holding a second face by a holding sheet via an adhesive layer, the second face being an opposite side of the substrate with respect to the first face;
   singulating the substrate into a plurality of element chips by etching the substrate exposed to the opening with a first plasma until the substrate reaches the second face so that the plurality of element chips are held by the holding sheet via the adhesive layer; and
   removing the mask from surfaces of the plurality of element chips so that the plurality of element chips from which the mask is removed are held by the holding sheet via the adhesive layer,
   wherein at the time of removing the mask, the mask is removed from the plurality of element chips with alkaline chemicals having a dissolution rate of the mask greater than a dissolution rate of the adhesive layer.

2. The method of claim 1,
   wherein the holding sheet is formed of polyolefin,
   the adhesive layer is formed of an acrylic adhesive,
   the mask is formed of a novolak resin, and
   the chemicals contain tetramethyl ammonium hydroxide.

3. The method of claim 1,
   wherein the chemicals contain a metal anticorrosive agent.

4. The method of claim 1,
   wherein the mask is removed with the chemicals while irradiating the mask with bubbles or applying ultrasonic vibration to the mask.

5. The method of claim 1, further comprising:
   removing at least a part of the mask by exposing a surface of the mask to a second plasma containing oxygen before the removing the mask with the chemicals.

6. The method of claim 1, further comprising:
   increasing a selectivity before the removing the mask from the plurality of element chips with the chemicals, the selectivity being the dissolution rate of the mask with respect to the chemicals divided by the dissolution rate of the adhesive layer with respect to the chemicals.

7. The method of claim 6,
   wherein the mask is formed of a positive resist in which the dissolution rate of the mask into a developer is increased by irradiation with ultraviolet rays,
   the adhesive layer is formed of an acrylic adhesive,
   the chemicals include the developer, and
   the positive resist is irradiated with the ultraviolet rays at the time of the increasing the selectivity.

8. The method of claim 7,
   wherein the mask is further provided with a ultraviolet absorbing film formed under the positive resist.

9. The method of claim 6,
   wherein when the mask is irradiated with ultraviolet rays radiated by the first plasma, the selectivity is increased, during the singulation.

10. The method of claim 1, further comprising:
    expanding an interval between the plurality of element chips held by the holding sheet via the adhesive layer by stretching the holding sheet after the singulation and before the removing the mask from the element chips with the chemicals.

11. The method of claim 6, further comprising:
    removing at least a part of a mask by exposing a surface of the mask to a second plasma containing oxygen before the removing the mask with the chemicals,
    wherein in the exposing the surface of a mask to the second plasma, when the mask is irradiated with ultraviolet rays radiated from the second plasma, the selectivity is increased.

* * * * *